United States Patent
Kiel et al.

(10) Patent No.: US 7,281,223 B2
(45) Date of Patent: Oct. 9, 2007

(54) SYSTEM AND METHOD FOR MODELING AN INTEGRATED CIRCUIT SYSTEM

(75) Inventors: Stephen N. Kiel, Mission Viejo, CA (US); Snehamay Sinha, Dallas, TX (US); Gregory E. Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 261 days.

(21) Appl. No.: 11/013,589

(22) Filed: Dec. 16, 2004

(65) Prior Publication Data

US 2006/0048081 A1 Mar. 2, 2006

Related U.S. Application Data

(60) Provisional application No. 60/605,867, filed on Aug. 31, 2004.

(51) Int. Cl.
*G06F 17/50* (2006.01)
*H03K 17/693* (2006.01)

(52) U.S. Cl. .......................................... 716/4; 716/15
(58) Field of Classification Search ................ 716/4–5, 716/15
See application file for complete search history.

(56) References Cited

U.S. PATENT DOCUMENTS 6,177,792 B1 * 1/2001 Govari et al. .......... 324/207.12
6,212,490 B1 * 4/2001 Li et al. ..................... 703/14
6,530,065 B1 * 3/2003 McDonald et al. ............ 716/4
2003/0113981 A1 * 6/2003 Combi et al. .............. 438/424
2003/0182641 A1 * 9/2003 Yang ............................ 716/4
2004/0042156 A1 * 3/2004 Devoe et al. ............ 361/321.2
2004/0095098 A1 * 5/2004 Turner et al. ............... 320/167
2004/0162711 A1 * 8/2004 Quint et al. .................. 703/4
2004/0268283 A1 * 12/2004 Perry et al. ................. 716/11
2005/0096888 A1 * 5/2005 Ismail ........................... 703/2
2005/0270042 A1 * 12/2005 Doljack ..................... 324/686

OTHER PUBLICATIONS

Paul Wu, "ViperBGA: A Novel Design Approach to High Perfromance and High Density BGA's", 1997, Enabling Solutions Inc., pp. 386-390.*

* cited by examiner

*Primary Examiner*—Paul Dinh
*Assistant Examiner*—Suresh Memula
(74) *Attorney, Agent, or Firm*—Yingsheng Tung; Wade James Brady, III; Frederick J. Telecky, Jr.

(57) ABSTRACT

The teachings of the present invention provide a method for modeling an integrated circuit system including a microchip, an integrated circuit package, and a printed circuit board. The method includes generating a configuration file including parasitics regarding ball grid arrays and vias intended for use in design of the integrated circuit system. A netlist may be generated using the configuration file. In accordance with a particular embodiment of the present invention, the operation of the integrated circuit system may be simulated to determine anticipated operating characteristics of the integrated circuit system.

7 Claims, 2 Drawing Sheets

SYSTEM AND METHOD FOR MODELING AN INTEGRATED CIRCUIT SYSTEM

RELATED APPLICATIONS

This application claims the benefit of U.S. Provisional Patent Application Ser. No. 60/605,867, filed on Aug. 31, 2004, and currently pending.

FIELD OF INVENTION

The present invention relates generally to semiconductor devices and more particularly to a system and method for modeling an integrated circuit system.

BACKGROUND OF THE INVENTION

Designing circuits that are used in products such as digital signal processors requires making predictions of how the individual circuit elements, such as transistors, will behave. Modeling individual circuit elements requires making predictions of how the fabrication process affects the behavior of the resulting circuit elements. By making predictions, circuit designers can understand how the circuit will operate without the time and expense of actually building the circuit. Modeling circuits is problematic when the characteristics of the individual circuit elements are not known. Known methods for modeling such circuit elements, however, have not been completely satisfactory with respect to efficiency and accuracy.

Known methods for predicting circuit element characteristics include using post-silicon models and using process and device simulators. Post-silicon models predict how a process affects the behavior of a circuit element using measurements from existing circuit elements fabricated under the same process. These predictions may be made using a standard circuit transistor element model. A problem with this method is that it cannot be used to make predictions about circuit elements fabricated using a different process. Alternative models, generated using process and device simulators, may be used to predict the behavior of circuit elements fabricated under different processes. These process and device simulators use equations describing the underlying physics to predict the effect of a process on a circuit element and its corresponding effect on the circuit. Prior models generated using these simulators, however, were not sufficiently accurate.

While these approaches have provided improvements over prior approaches, the challenges in the field of circuit fabrication has continued to increase with demands for more and better techniques having greater efficiency and accuracy.

Design and analysis of integrated circuit systems including the chip, package and printed circuit board, becomes more complex as the size of the system is reduced, and the number of components and complexity increases. Modeling is used to simulate performance and operating characteristics of a particular integrated circuit system design. Modeling provides an analysis tool that may assist a designer in evaluating cost and performance criteria, to determine the economic feasibility of meeting or exceeding particular specifications, without actually manufacturing a chip or package. In this manner, the operation and performance of the package is simulated, using one or more of various techniques.

Unfortunately, accurate modeling of integrated circuit packages by known methods require that the design of many components be substantially complete, in order to account for their effect on the operation of the system. For example, many current solutions for analyzing electrical characteristics of a package, use post-layout extracted netlist(s) or computer generated models that are based upon the full package geometry. Both of these processes generate netlists that are too large to be practical for doing multiple simulations and evaluating alternatives. The extracted netlist is obtained too late in the design stage to be of assistance in making architectural design decisions. The design of such systems takes a significant amount of time and resources, that may be lost if the results of the analysis are unfavorable. Moreover, accurate modeling by known methods apply to small portions of the design, but are impossible to perform on the entire design, based upon the amount of data and number of calculations required of the particular analysis tool(s).

SUMMARY OF THE INVENTION

In accordance with the present invention, a system and method for modeling an integrated circuit package is provided that substantially eliminates or greatly reduces disadvantages and problems associated with conventional techniques.

According to one embodiment of the present invention, a method for modeling an integrated circuit system including a microchip, an integrated circuit package, and a printed circuit board, includes generating a configuration file including parasitics regarding ball grid arrays and vias, intended for use in design of the integrated circuit system. A netlist is generated using the configuration file. In accordance with the species of the present invention, the operation of the integrated circuit system may be simulated to determine anticipated operating characteristics of the integrated circuit system.

In accordance with another embodiment of the present invention, the netlist may be a top level netlist that incorporates a printed circuit board netlist, and a hierarchical chip level netlist.

Certain examples of the invention may provide one or more technical advantages. A technical advantage of particular embodiments of the present invention is a system and method for modeling and simulating a proposed design of an integrated circuit system analyzing different package configurations in context with microchip parasitics, microchip power supply noise, and a printed circuit board netlist. Accordingly, the analysis may be done in the architectural stage of design to support a "reliability test design". The reliability test design is a version of the package design that is used for mechanical stress testing. The reliability testing and the IC design are accomplished in parallel which in turn requires the package configuration to be committed early in the design. The analysis allows for improved choices for performance and costs to be made early in the process, to avoid an impact on the overall design schedule.

Another technical advantage of the particular embodiments of the present invention include a modeling and simulation analysis that is based upon physical parameters that can be modified as different package types are explored and different corner conditions are explored. Thus, the efficiency of the model and analysis is increased, and allows a design team to make running multiple simulations using current simulation tool, more practical.

Other technical advantages may be readily apparent to one skilled in the art from the figures, descriptions and claims included herein. None, some, or all of the examples may provide technical advantages.

BRIEF DESCRIPTION OF THE DRAWINGS

For a more complete understanding of the present invention and its features and advantages, reference is now made to the following description, taken in conjunction with the accompanying drawings, in which like reference numerals refer to like elements, and wherein.

DETAILED DESCRIPTION OF THE INVENTION

An embodiment of the present invention and its advantages are best understood by referring to FIGS. 1-4 of the drawings, like numerals being used for like and corresponding parts of the various drawings.

Figure 1:
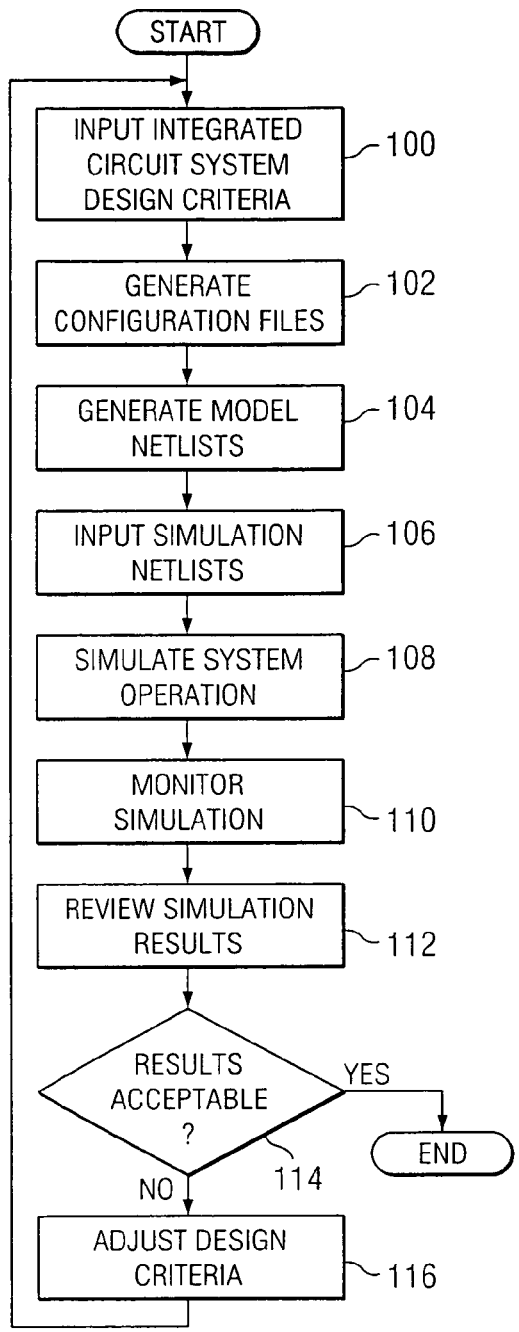
FIG. 1 illustrates a method for modeling, simulating, adjusting, and/or improving the design of an integrated circuit system, in accordance with a particular embodiment of the present invention.

FIG. 1 illustrates a method for modeling a system that includes a microchip, a package and a printed circuit board (PCB). The method of FIG. 1 may be used to analyze the electrical characteristics of power switching noise associated with a particular design, for example a multimillion-gate design, on the package and PCB. The modeling and simulation can be done at the architectural stage of the design to enable designers to consider tradeoffs (e.g., cost versus performance) of different package configurations. The electrical analysis may be used to determine instantaneous IR and L di/dt drop that is anticipated at the chip power connections through the package and printed circuit board. In Mixed Signal designs, the frequency and magnitude of the instantaneous voltage drop should be considered, as it is the noise that will couple through the analog section of the chip. The modeling/simulation techniques of FIG. 1 include the following modeling elements, that are factored into a single simulation: (i) a noise model for the chip; (ii) a parasitic model for the chip; (iii) a compact electrical model for the package; and (iv) an electrical model for the printed circuit board.

The method begins at step 100, where integrated circuit system design criteria are input. Such design criteria may include topology and global parameters related to the proposed integrated circuit system design. In accordance with a particular embodiment of the present invention, a text editor may be used to input such criteria into a template configuration file resident upon a computer, to be used for at least a portion of the modeling. Various characteristics of the proposed design may be included with the topology and global parameters including, but not limited to, the following global parameters:

Inductance, capacitance and resistance values for ball grid arrays (BGAs) to be used in the design
Inductance, capacitance and resistance values for package vias (interconnects) to be used in the design
Package plane to plane coupling capacitance
Number of BGAs and vias that are allocated to core power
Number of BGAs and vias that are allocated to IO power
Number of BGAs and vias that are allocated to ground
DC current source values
AC current source values
Voltage for powering core logic subcircuits
Number of simultaneously switching registers
Target skew of the switching registers
Average number of standard loads per register
Value of the standard load for the target process At step 102, a configuration file is generated using the topology and global parameters input at step 100, that reflects technology and design parameters of the proposed design. The configuration file is generated using a configuration file generation computer program that receives an edited version of a configuration file template, and an edited version of a "clone" configuration file. The elements of the configuration file form the fundamental building blocks for the package models, the chip noise models, and the parasitic capacitance models to be described below in more detail. In accordance with a particular embodiment of the present invention, the data that forms the configuration file(s) is entered in a keyword and data format (e.g., text files). More particularly, the configuration file may be in a simple ASCII text format, making it easier to maintain in a configuration management system, and to track the changes in the design over time.

Next, at step 104, model netlists are generated, that are based upon the configuration file. To accomplish this, the configuration file is fed into a netlist generator computer program that reads the configuration file and generates the netlists to be used in the simulation. The netlist generator computer program also receives data regarding cell circuit netlists, transistor models, and circuit board netlists, that may be used to accomplish simulation.

The netlists are text files that describe how the components of the system are connected together. Netlists are often used in circuit simulation and logic circuit simulation to provide a text representation of a system or circuit schematic. In accordance with a particular embodiment of the present invention, the result of this step is a complete SPICE (Simulation Program Integrated Circuits Especially!) netlist in the target process technology, meaning the netlist syntax is compatible with the SPICE circuit simulator, or an equivalent commercial simulator capable of reading or translating the spice input netlist. SPICE is used to provide a reasonably detailed analysis of circuits containing active components such as bipolar transistors, field effect transistors, diodes and lumped components such as resistors, capacitors and inductors. SPICE is a circuit simulation program, not a logic simulation program. Thus SPICE considers the voltages and currents in a circuit to be continuous quantities (e.g., waveforms), not quantized into high/low values.

The netlist is generated from various technology files and sub-circuit netlists, representing collectively, the chip, the package and the printed circuit board. In accordance with a particular embodiment, the netlist may be generated in less than a minute, representing a design having in excess of one million logic gates. The netlist generated at this step may be considered a "top level" netlist, that incorporates, among other things, following principle elements:

A printed circuit board netlist which is integrated into the top level netlist by a computer program
Statements to probe the simulation and perform measurements for analysis are also integrated into the top level netlist using the computer program A detailed hierarchical package netlist (model) that is generated by the computer program, is integrated into the top level netlist Hierarchical chip level models that are generated by the computer program for both transient and AC analysis, and integrated into the top level netlist The model netlists that are generated at step 104 may include different types of simulation netlists. For example, output from the netlist generator computer program may include transient simulation netlists, and AC simulation netlists. Some or all of the various types of netlists may be input to an integrated circuit system simulator, at step 106.

Next, at step 108, operation of the integrated circuit system is simulated, in order to predict operational characteristics of the proposed integrated circuit system design. During simulation, an operator of the simulator may monitor the simulation, at step 110, in order to verify that particular operational characteristics remain within an expected or desired range. For example, as discussed below, the operator may monitor waveforms generated during the simulation, to confirm that the number of registers used in the model produce a smooth and repeatable current function.

At step 112, the results of the simulations are reviewed to determine the acceptability of the proposed design. If the operating parameters and characteristics are determined to be acceptable at step 114, and no additional simulation or data is desired, the method ends. However, if the operating characteristics are not acceptable, the design criteria may be adjusted at step 116, and the simulation method is performed again, to determine operating characteristics and parameters associated with the new design criteria. It should be recognized that the simulation method of FIG. 1 may be repeated any number of times, until an acceptable, or most acceptable design is selected.

Thus, the modeling, simulation, and electrical analysis of the method of FIG. 1 includes four parts: (i) collecting package characteristics and physical constants; (ii) specifying the chip and printed circuit board characteristics; (iii) building the nominal simulation deck and corner case permutations; and (iv) running the simulations, evaluating the result and recommending changes based on the results. The results may also be used for chip IR drop/power analysis and chip noise coupling analysis to be included in a design budget.

The method of FIG. 1 may be performed at the architectural stage of design to support the "reliability test design", and allows a design team to analyze different configurations in context with the chip parasitics, chip power supply noise, and the printed circuit board netlist. The analysis allows for improved choice for performance and cost to be made at a time that does not adversely impact the overall design schedule. There is typically design latitude during the architecture phase, to make significant changes to the design. Later in the design flow, significant changes would adversely impact the schedule.

Moreover, the analysis model is based on physical parameters that can be modified as different package type are explored and different corner conditions are defined and/or explored. The power of the present invention relies on an efficient model to allow a design team to make running multiple simulations using a combination of current simulation tools more practical.

The output of the analysis allows a design team to determine the transient response due to Core Logic Switching, transient response due to Simultaneous Switching Outputs (SSO) and AC response of the chip power and ground looking back through the package and printed circuit board.

As discussed above, the modeling and simulation techniques of FIG. 1 allow the analysis of switching noise response and power supply frequency response, and incorporates: (i) the fundamental electrical characteristics (L-inductance, R-resistance, and C-capacitance) of the BGAs, and vias, and planes; (ii) current transients generated by the actual number of switching gates in the target process; (iii) a schematic of the printed circuit board with the actual filter elements and their parasitics; and/or (iv) probe and measure statements in the SPICE deck to help evaluate the simulation results.

The netlists that are generated in accordance with the present invention are efficient in simulation of operating characteristics. For example, the hierarchical, abstract format for the netlists, will form a small nodal matrix when the simulation is run in a SPICE simulator. The small nodal matrix has a direct positive impact on simulation throughput. The rapid turn around time for simulation, and the ability to modify the design characteristics by changing the configuration file, supports exploring a vast range of cost versus performance options, early on in the design. A log file may be produced along with the netlist, that contains the parameters used for constructing the netlist. The log file may be used in de-bugging and analysis of the simulation tool. Moreover, a significant benefit of building the netlist model from parameters based on the physical characteristics, is the understanding of the results based on variations of those parameters.

The netlist of the present invention is a compact and efficient netlist of the package and the chip noise source. In other words, the resultant netlist is much more workable, than a netlist that is generated using actual design criteria, as opposed to the modeling techniques described herein. By way of example, if there were one million logic gates in a particular design, and each was represented in a netlist, SPICE modeling could not be done, due to its limited simulation capacity.

Figure 2:
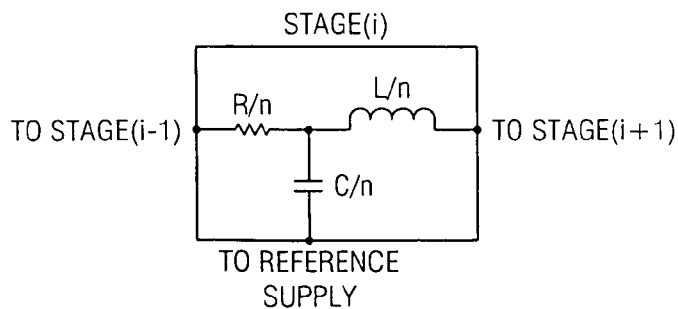
FIG. 2 illustrates an example of a model element for distributed inductance resistance and capacitance for electrically modeling components of the integrated circuit system.

In accordance with the teachings of the present invention, the hierarchical package netlist discussed above is built using "ideal capacitors" for the power and ground planes, and transmission line models for the signal traces. In this embodiment, vias and BGAs are represented as distributed, multistage networks. Lumped numbers for inductance, resistance and capacitance are distributed to a particular number of stages, represented herein as "n." A diagram of a particular stage, represented herein as the "i" stage, is illustrated in FIG. 2. The diagram of FIG. 2 illustrates an example of an algorithm that is suitable for electrically modeling vias of a package.

The number of stages, or "n" may be a characteristic selected for a particular element of the system. The actual number for any given element may be determined empirically by varying "n" and checking for differences in the "behavior" of the model (e.g., by trial and error). For example, a value of "n" equal to five has proven adequate for many configurations. In some high frequency configurations, a value greater than five may be selected.

The diagram of FIG. 2 may be referred to as a distributed impedance model. It does not account for the mutual inductance experienced between vias and BGAs. Depending upon the proximity, current flow in opposite directions (e.g., neighboring VDD and VSS vias) will have a somewhat lower effective inductance. In accordance with the teachings of the present invention, the lowered effective inductance may be modeled in the lumped numbers included in the configuration file. In an alternative embodiment, the mutual inductance between vias and BGAs may be explicitly modeled, and accounted for in the modeling techniques described herein.

The hierarchical chip level model is a chip current and noise model and is built using standard cells in conjunction with ideal stimulus and loads for the transient analysis, and with AC current sources for the AC analysis. In accordance with the teachings of the present invention, the chip intrinsic decoupling capacitance from non-switching cells is modeled using one of two techniques: (i) cell level model; or (ii) "ideal capacitance." The power/ground current noise that is modeled, is due to the simultaneous switching of core logic registers for the VDD (Power Supply Voltage) to VSS (ground voltage) noise, or due to the simultaneous switching of the output buffers for the VDDS to VSS noise.

The core logic-switching model produces an estimate of the current that is likely to be experienced from a given number of registers switching together. The following variables may be obtained, predefined, and/or determined as part of the modeling techniques described herein: (i) target skew of the clock tree designs; (ii) the number of registers that can switch at the same time; (iii) the average number of standard loads that will be experienced (e.g., from wire load tables); and/or (iv) mapping from standard loads to capacitance for a particular IC design process.

The skew number is used to define a window in time during which the gates will be driven (e.g., switched). The modeling program of the present invention randomizes the trigger time of the cells within the skew window, and varies the load of the cells to produce conditions that are similar (probabilistically) to the design. Average loading is used to define the average loading that will be experienced on the cells in the model.

In accordance with a particular embodiment, the number of registers per clock domain is predetermined by the designer's (or design team's) budget for the design RTL description. The chip gate count is also typically available at this time. These variables are natural byproducts of preliminary integrated circuit system planning.

Figure 3:
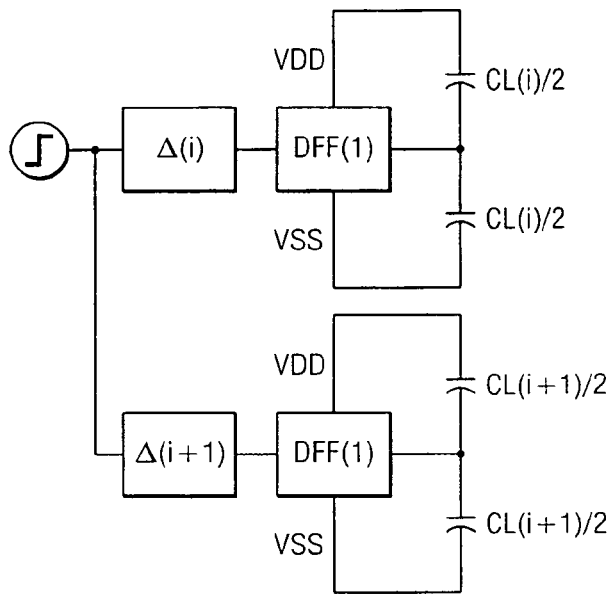
FIG. 3 is an electrical schematic that illustrates a method for a program to direct and drive registers, in accordance with a particular embodiment of the present invention.

FIG. 3 illustrates an example embodiment of the manner in which the program connects and drives the registers. Δ(i) of FIG. 3 is a delay that is a random number between 0 and the maximum skew. CL(i) is a random capacitance value between 1 and C-max. C-max is equal to C (average) times 2. The total number of active registers in a clock tree (e.g., leaf cells) is represented by the number n.

Many current designs include enough registers to make simulation times too long, if each register is represented explicitly. The teachings of the present invention use a sufficient, predetermined fraction of the actual, anticipated number of registers to ensure a smooth and repeatable current function, and use an associated multiplication factor to ensure the proper magnitude. During modeling, the waveform of the composite current function from the registers triggering is examined in simulation to determine that a smooth function is being produced. The number of samples, or instances, required will depend upon the skew. In accordance with a particular embodiment of the present invention, it has been determined that 500 instances works well for several designs being modeled.

The intrinsic decoupling that will be present in the chip due to non-switching gates, is either represented as an ideal capacitance between the supply and ground, or by including non-switching gates in the netlist. The magnitude of the effect of non-switching gates may be modeled by using a small representative set selecting the correct multiplier.

As illustrated, a DC current source is connected in parallel with the cell based noise source so any issues with steady state drop due to resistance will be apparent in the transient simulation.

Simultaneous Switching Output buffers are modeled in a similar fashion, except the loading is off chip and off package, and connected through transmission line models. A diagram of the package model for transient switching analysis is included in FIG. 4 and will be described below in more detail.

In accordance with the teachings of the present invention, a second netlist may be produced for AC analysis with an AC current source in place of the DC current source and the switching gates. The AC analysis demonstrates the package impedance with respect to frequency. The results of this analysis provide another "view" of the design, and allow the designer to evaluate different characteristics from different perspectives.

Figure 4:
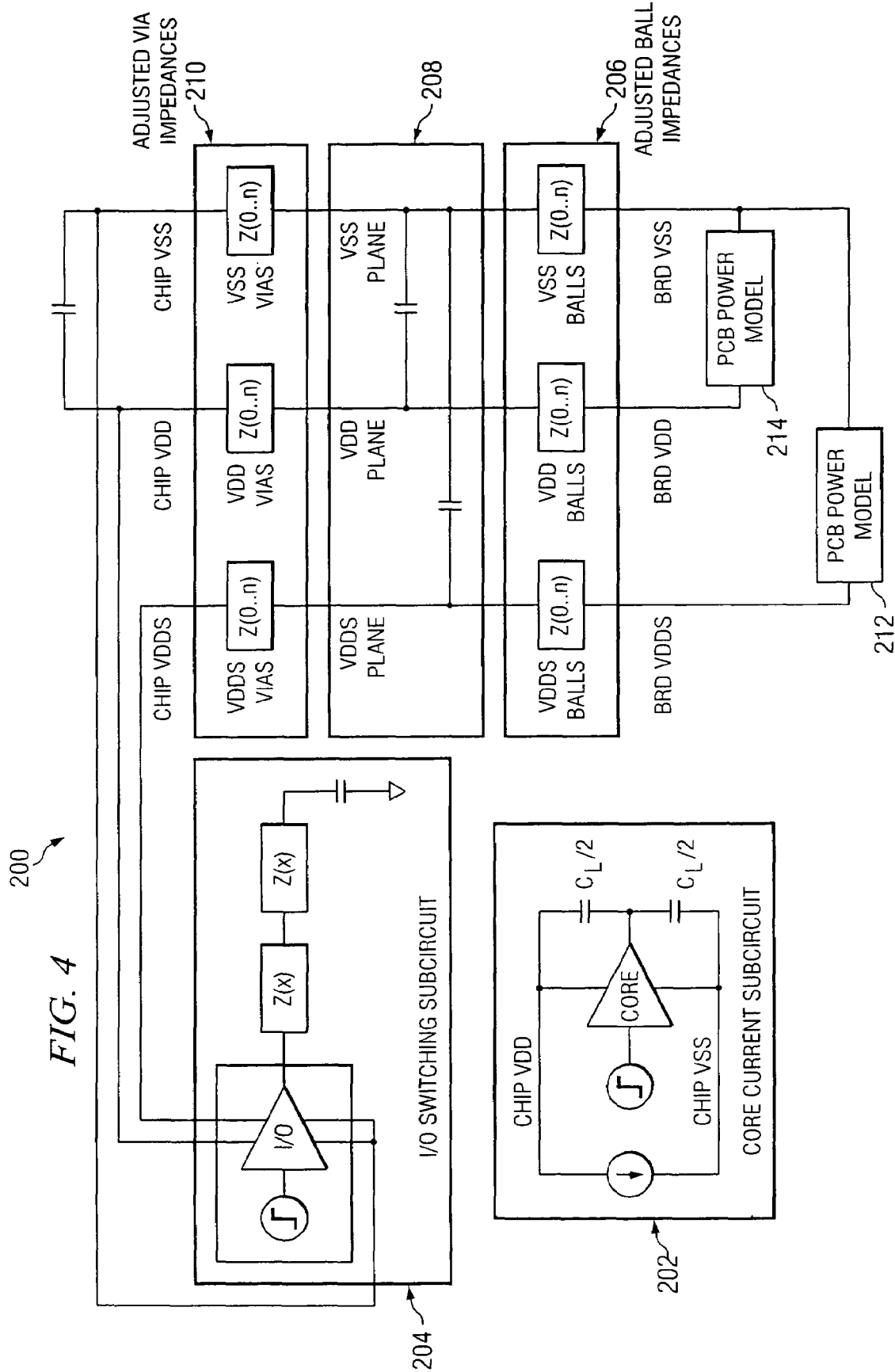
FIG. 4 illustrates a flow diagram for modeling the overall system, in accordance with a particular embodiment of the present invention.

FIG. 4 is a high level view of a system 200 that is being simulated. FIG. 4 illustrates how the detailed elements illustrated in FIGS. 2 and 3, and those described in this specification are connected to form the complete system.

On the left-hand side of FIG. 4 two blocks representing the available input stimulus: (i) core standard cells 202; and (ii) IO cells 204, are illustrated. The core standard cell block 202 and IO cell block 204 represent the groups of standard cell transistor level netlists that are hooked together, driving loads that create the VDD and VSS, or the VDDS to VSS noise waveforms that are being studied.

The three blocks 206, 208, and 210 on the right side of FIG. 4 comprise the package model. The via and Ball models 206 and 210 represented as Z(0 . . n) are built from a series of LCR networks shown in FIG. 2. The specific LRC values are computed from the coefficients in the provided technology file. The values for package plan to plane capacitance, which is modeled using ideal capacitors, are also from the configuration file.

PCB Power Models 212 and 214 represent the spice netlists for the routing form ideal supplies through the PCB. Characteristics for the PCB components Inductors and Decoupling capacitors are taken from their datasheet specifications. The Capacitor and Inductor ideal values along with their ESL and ESR are modeled.

FIG. 4 illustrates the top level hookup for the various analysis modes, by hooking up one of the power noise sources, core transistor switching, core AC response, or IO Switching to the package and the PCB models. The analysis encompasses examining the voltage waveforms seen at the chip, as well as examining the effects on the signal waveforms produced by the cell subcircuit blocks.

Thus, as illustrated in FIG. 4, the netlist that is generated is input to a SPICE simulator, to simulate how a particular configuration of package, chip noise model, and printed circuit board address specific design requirements or parameters. The high level diagram of FIG. 4 illustrates indicates the simulation model for the Simultaneous Switching of both the output buffers and the core logic. The microchip VDD to VSS voltage may be monitored to determine the worst-case dynamic voltage drop. The frequency response of the overall circuit to a transient from VDD to VSS may also be observed, during simulation. Using an AC current source in place of the Switching Sources, and AC analysis of the package and printed circuit board may also be performed.

The initial simulation model that used in accordance with the teachings of the present invention is based upon information that is available early in the design stage of an integrated circuit system. The parasitic data may include historical numbers based upon an earlier designs, and/or calculations from available formulas. As the design matures, some of the design topology may change, and/or new physical constants may become available. When this occurs, the configuration file can be updated with any new information that is available, a new netlist can be generated, and the analysis may be updated to reflect the new information. The ability to update the model as the design parameters evolve, allows a designer to perform a quantitative analysis with the highest quality modeling data available at that time. The effective changes in circuit topology or parameter values on the performance margin of the design, may also be tracked.

The simulation may be performed upon many variations within corner cases (minimum/maximum values) of the integrated circuit package, PCB, or chip configuration. This simulation of many of these variations produces a quantitative result for the electrical performance of that configuration. As component pieces of the integrated circuit system are built from smaller elements, whose accuracy margins are understood, the overall margin of error for the model can be determined by building corner cases based upon the worst and best case values of the such component elements.

The teachings of the present invention provide a solution for modeling and simulating performance of a design that produces a quantitative analysis early in the flow (e.g., design stage), with substantially better simulation throughput, and comprehensive scope, as it models the chip switching, and the printed circuit board along with the package. The model and simulation of this methodology focus on the aggregate behavior of the individual elements of the design, for building an accurate system model. The focus is on the accuracy of the modeling the average element, and understanding the potential variation in these average values.

The hierarchical, aggregate model of the present invention is more compact and efficient in simulation than a "flat" netlist. It is also scalable and allows a designer to change the physical attributes of the package design (e.g., layer dimensions) without affecting the simulation time or accuracy. These structures mirror the physical design, so that a designer is able to probe a design at real physical boundaries (maximum/minimum), see the effects of changing individual parameters, and obtain a better understanding of the design's performance in terms of the individual element. The simplicity of this modeling technique allows the elements of the design to be modeled in detail, rather then trying to "reduce" a detailed netlist. This methodology also supports a pre-layout and post-layout (Package and PCB) analysis of the design.

Thus, the teachings of the present invention provide a solution to accomplish electrical analysis in the architectural planning stage of the design flow, giving the design team sufficient time to make changes to the design and consider the effect of alternatives. The teachings of the present invention can be used to support the "reliability design" which must be physically similar to the final design, but is typically completed far in advance of the actual design. The modeling flow uses a relatively small set of inputs that can come from historical data, or from calculations from equations. The inputs may be updated, and the modeling and simulation rerun, as better design-based data becomes available. Accordingly, the modeling and simulation techniques described herein provide the capability to make design decisions based on quantitative data while there is still flexibility and design options.

Since the elements of the model are physically based, and the range of expected values can be determined, corner condition models of the package design may be produced. Margins for deviation from the "nominal case" can be understood and quantified from corner case simulations. The model may be built to practically any target process, without employing hand processed scaling adjustments, because noise sources of the model are obtained from standard cell models (spice netlists). Also, different alternative designs can be built relatively quickly, and evaluated to provide a rapid exploration of the design space.

Although the present invention has been described in detail, it should be understood that various changes, alterations, substitutions, and modifications can be made to the teachings disclosed herein without departing from the spirit and scope of the present invention which is solely defined by the appended claims.

What is claimed is:

1. A method for modeling an integrated circuit system including a microchip, an integrated circuit package, and a printed circuit board, the method comprising:
   generating a configuration file including parasitics regarding ball grid arrays and vias intended for use in design of the integrated circuit system;
   generating, using the configuration file, a netlist including a top level netlist, which further comprises:
      a printed circuit board netlist;
      an hierarchical package netlist that abstracts physical behavior of the parasitics and is configured using mathematical models of ideal capacitors for power planes and ground planes of the integrated circuit package, representing the vias and the BGAs as distributed, multistage networks and wherein lumped numbers for inductance, resistance and capacitance are distributed to a reselected number of stages; and
      an hierarchical chip level netlist that abstracts behavior of the chip; and
   simulating, based upon the configuration file, operation of the integrated circuit system to determine anticipated operating characteristics of the integrated circuit system.

2. The method of claim 1, wherein the top level netlist further comprises commands to probe the simulation and perform measurements for analysis of the integrated circuit system.

3. The method of claim 1, wherein the top level netlist comprises a Simulation Program Integrated Circuits Especially (SPICE) netlist.

4. The method of claim 1, wherein the top level netlist comprises an ASCII text file.

5. A method for modeling an integrated circuit system including a microchip, an integrated circuit package, and a printed circuit board, the method comprising:
   generating a configuration file including parasitics regarding ball grid arrays and vias intended for use in design of the integrated circuit system;
   generating, using the configuration file, a netlist including a top level netlist, which further comprises:
      a printed circuit board netlist;
      an hierarchical package netlist that abstracts physical behavior of the parasitics; and an hierarchical chip level netlist that abstracts behavior of the chip; and comprises an AC current source analysis component and a transient analysis component, wherein the transient analysis component comprises a chip current and noise model that is configured using standard cells in conjunction with ideal stimulus and loads; and simulating, based upon the configuration file, operation of the integrated circuit system to determine operating characteristics of the integrated circuit system.

6. The method of claim 5, wherein the hierarchical chip level model accounts for chip intrinsic decoupling capacitance from non-switching cells using a cell level modeling technique.

7. The method of claim 5, wherein the hierarchical chip level model accounts for chip intrinsic decoupling capacitance from non-switching cells using an ideal capacitance mathematical modeling technique.

* * * * *